United States Patent
Kern et al.

(10) Patent No.: US 6,628,152 B1
(45) Date of Patent: Sep. 30, 2003

(54) METHOD FOR MONITORING A PROPER FUNCTIONING OF AN INTEGRATED CIRCUIT

(75) Inventors: Thomas Kern, München (DE); Diether Sommer, München (DE)

(73) Assignee: Infineon Technologies AG, Munich (DE)

( * ) Notice: Subject to any disclaimer, the term of this patent is extended or adjusted under 35 U.S.C. 154(b) by 48 days.

(21) Appl. No.: 09/510,640

(22) Filed: Feb. 22, 2000

Related U.S. Application Data

(63) Continuation of application No. PCT/DE98/02115, filed on Jul. 27, 1998.

(30) Foreign Application Priority Data

Aug. 20, 1997 (DE) .......................... 197 36 195

(51) Int. Cl.⁷ ................................ H03L 7/00
(52) U.S. Cl. ................... 327/143; 327/198; 327/544; 327/77
(58) Field of Search ................ 327/77, 78, 142, 327/143, 198, 544

(56) References Cited

U.S. PATENT DOCUMENTS

| | | | | |
|---|---|---|---|---|
| 4,902,910 A | * | 2/1990 | Hsieh | 327/143 |
| 5,146,111 A | * | 9/1992 | Ciraula et al. | 327/143 |
| 5,199,032 A | | 3/1993 | Sparks et al. | 371/3 |
| 5,371,709 A | | 12/1994 | Fisher et al. | 365/226 |
| 5,397,946 A | | 3/1995 | Truong et al. | 327/74 |
| 5,629,642 A | * | 5/1997 | Yoshimura | 327/142 |
| 5,994,888 A | * | 11/1999 | Yanagawa | 323/313 |

FOREIGN PATENT DOCUMENTS

| | | |
|---|---|---|
| DE | 2460245 | 6/1976 |
| EP | 0598475 A2 | 5/1994 |
| EP | 0661713 A1 | 7/1995 |

* cited by examiner

Primary Examiner—Terry D. Cunningham
Assistant Examiner—Quan Tra
(74) Attorney, Agent, or Firm—Laurence A. Greenberg; Werner H. Stemer; Ralph E. Locher

(57) ABSTRACT

A proper functioning of an integrated circuit is monitored by monitoring a supply voltage of the integrated circuit. Dips in the supply voltage are ascertained. A signaling of the dips in the supply voltage is only effected if the supply voltage falls below a given voltage for a given minimum duration. As a result, the reliability of the integrated circuit is increased.

9 Claims, 1 Drawing Sheet

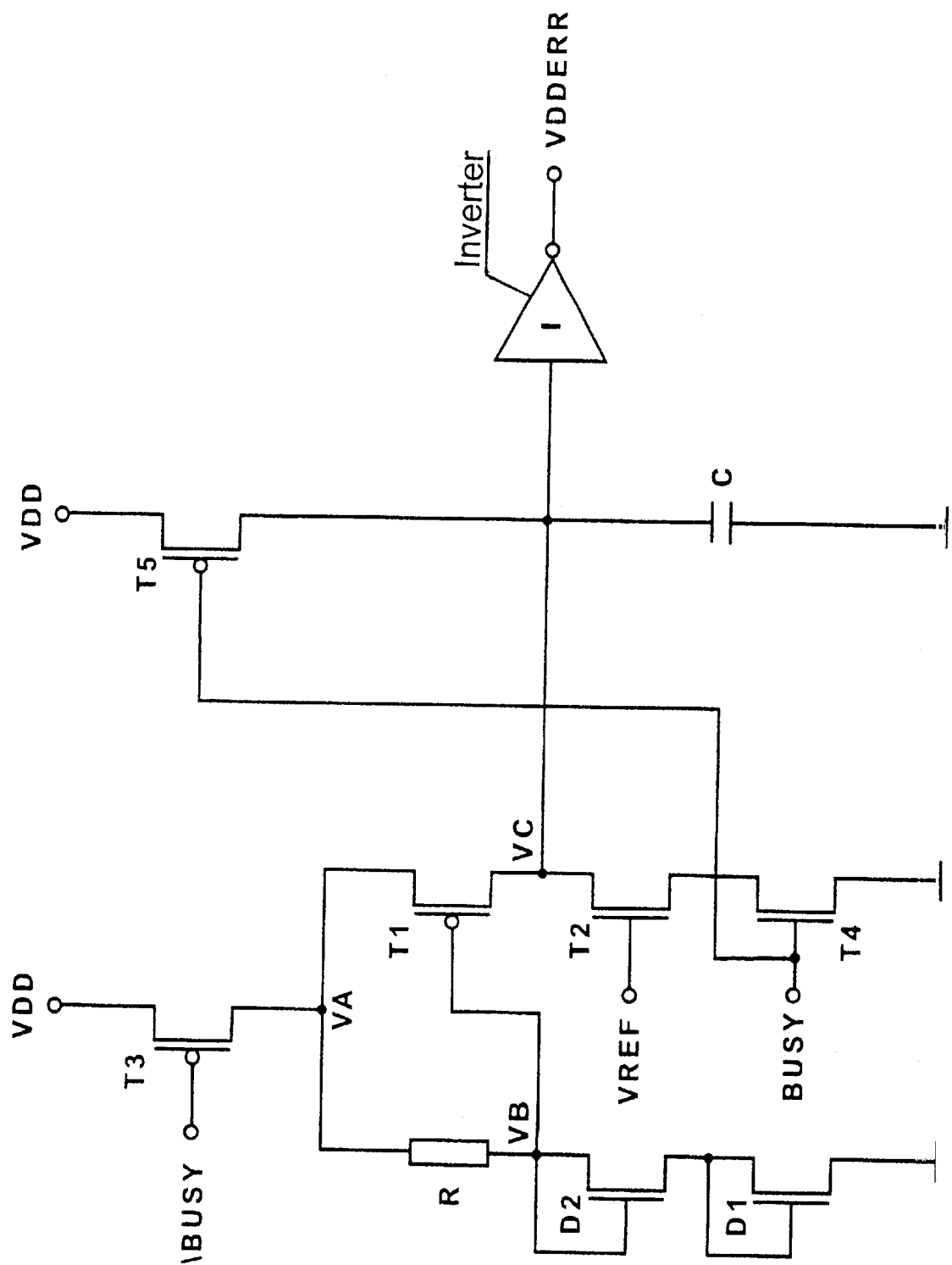

METHOD FOR MONITORING A PROPER FUNCTIONING OF AN INTEGRATED CIRCUIT

CROSS REFERENCE TO RELATED APPLICATION

This application is a continuation of International Application No. PCT/DE98/02115, filed Jul. 27, 1998, which designated the United States.

BACKGROUND OF THE INVENTION

Field of the Invention

The invention relates to a method for monitoring the proper functioning of an integrated circuit. The supply voltage of the integrated circuit is monitored and dips in the supply voltage that are ascertained in the process are signaled.

The proper functioning of devices of every type is, understandably, the intended objective of every development. This applies in particular to integrated circuits because in their case extremely small errors can have disastrous effects. Efforts are continually being made, therefore, to increase the reliability of integrated circuits, but this is not exactly easy because of the increasing size of integrated circuits and their packing density.

Despite all previous efforts, it has not been possible heretofore to fabricate and to operate integrated circuits completely without errors.

U.S. Pat. No. 5,371,709 describes a method in which a reaction to a supply voltage dip takes place immediately, that is to say without delay That also means, however, that even momentary dips in the supply voltage, which frequently do not even result in a malfunction of the integrated circuit, cause an interruption as a reaction to the voltage dip.

Further methods for monitoring the proper functioning of integrated circuits are described in U.S. Pat. No. 5,199,032, U.S. Pat. No. 5,397,946 and the Published European Patent EP 0 598 475 A2.

SUMMARY OF THE INVENTION

It is accordingly an object of the invention to provide a method for monitoring the proper functioning of an integrated circuit which overcomes the above-mentioned disadvantages of the heretofore-known methods of this general type and which further improves the reliability of integrated circuits.

With the foregoing and other objects in view there is provided, in accordance with the invention, a method for monitoring a proper functioning of an integrated circuit. The method includes the steps of:

monitoring a supply voltage of an integrated circuit;
ascertaining a dip in the supply voltage; and
effecting a signaling of the dip in the supply voltage only if the supply voltage falls below a given voltage for a given minimum duration.

In other words, the method according to the invention provides that a signaling is only effected if the supply voltage falls below a predetermined voltage for a predetermined minimum duration.

In accordance with another mode of the invention, the signaling of the dip in the supply voltage is effected by outputting a signaling signal having a voltage of substantially zero volts.

In accordance with yet another mode of the invention, the signaling signal is provided as a signal having a value substantially equal to a value of the supply voltage if and as long as no dip in the supply voltage having a sufficient depth and length is present.

In accordance with a further mode of the invention, the monitoring step is carried out only if and as long as an activation signal is applied to a monitoring circuit.

In accordance with yet a further mode of the invention, if the activation signal is not applied, then a signaling signal is output, which corresponds to a signaling signal that would be output if the supply voltage were properly high during an activated monitoring.

In accordance with another mode of the invention, a level of the supply voltage is checked with a reference voltage which is independent of the level of the supply voltage.

In accordance with another mode of the invention, a level the supply voltage is checked dependent on a reference voltage which is independent of the level of the supply voltage.

In accordance with a further mode of the invention, operations, which are influenced by the dip in the supply voltage or which may have been influenced by the dip in the supply voltage, are repeated after an end of the dip in the supply voltage.

The signaling of supply voltage dips makes it possible for the integrated circuit, if required, to induce or cause automatically, through the use of a monitoring circuit or by itself or manually by an operator, a selective repetition of operations which have been carried out during and/or before and/or after a supply voltage dip and, consequently, may have proceeded with errors. Disturbances caused by supply voltage dips can thus be eliminated, as far as their effects are concerned, immediately and in a manner that is entirely unnoticeable to the outside in some instances.

Consequently, a method for monitoring the proper functioning of an integrated circuit has been found which enables the integrated circuit to be operated with a considerably higher reliability than before. The cause of the disturbance that has been identified may lie either within or outside the integrated circuit to be monitored.

Other features which are considered as characteristic for the invention are set forth in the appended claims.

Although the invention is illustrated and described herein as embodied in a method for monitoring the proper functioning of an integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The single FIGURE is a schematic diagram of a circuit for carrying out the method according to the invention.

DESCRIPTION OF THE PREFERRED EMBODIMENTS

Referring now to the single figure in detail there is shown a circuit for carrying out the method according to the invention. The integrated circuit or the part of the integrated circuit whose proper functioning is to be monitored is for example an EEPROM (electrically erasable programmable read-only memory). However, the method according to the invention is not restricted to EEPROMs; the invention can also be used in or for any other integrated circuits or circuit parts.

The supply voltage of the integrated circuit to be monitored is monitored by the method described. If a supply voltage dip is ascertained in the course of this monitoring, then this is signaled to the integrated circuit to be monitored and/or to other devices and/or to an operator, where "other devices" should be understood to mean, in particular, those devices through the use of which the integrated circuit to be monitored is driven or which are provided downstream of the integrated circuit to be monitored. The recipient of the signaling can thus identify that an error has possibly occurred during the operation of the integrated circuit, and is thus enabled to take measures in a targeted manner. These measures make it possible to eliminate or reduce any effects of the identified supply voltage dip that may have occurred, or at least to keep these effects small.

If the integrated circuit to be monitored is an EEPROM, it is thus possible to prevent the integrated circuit from having been incorrectly or incompletely erased or programmed in an unidentified manner. The programming and erasure of EEPROMs is extraordinarily dependent on the supply voltage since the latter is used in the EEPROM, inter alia, also as a reference voltage for the operation of the voltage pumps for generating a high voltage. If there is a dip in the supply voltage, then the high voltage generated no longer suffices for programming and erasing the EEPROM. However, owing to the fact that the supply voltage is monitored in the present case and supply voltage dips are signaled, a programming and/or erasure operation that has been carried out during the voltage dip can be repeated as required.

A circuit which can be used to carry out the monitoring of the supply voltage and the signaling of detected supply voltage dips is illustrated in the figure.

The circuit, which may be constructed in the manner shown in the figure or else may be constructed differently, is part of the integrated circuit to be monitored itself or is provided outside the integrated circuit. The integration of the monitoring circuit in the integrated circuit to be monitored is particularly advantageous because it is then possible also to detect supply voltage dips which occur exclusively locally within the integrated circuit to be monitored.

The circuit shown in the figure is configured to be realized as an integrated circuit or part of such a circuit. It includes PMOS transistors T1, T3 and T5, NMOS transistors T2 and T4, (MOS) diodes D1 and D2, an inverter I, a resistor R and a capacitor C, which are connected in the manner shown in the figure.

The circuit includes nodes designated by VA, VB and VC, where the node VA is situated at the drain terminal of the transistor T3, the node VB is situated at the gate terminal of the transistor T1, and the node VC is situated between the transistors T1 and T2.

Input signals VDD, VREF, BUSY and \BUSY are input into the circuit and an output signal VDDERR is output, where VDD is the supply voltage to be monitored and is applied to the source terminals of the transistors T3 and T5, VREF is a reference voltage and is applied to the gate terminal of the transistor T2, BUSY is an activation signal and is applied to the gate terminals of the transistors T4 and T5, \BUSY is the inverted activation signal BUSY and is applied to the gate terminal of the transistor T3, and the output signal VDDERR is the signaling signal for signaling detected supply voltage dips and is output by the inverter I.

The actual monitoring of the supply voltage is effected by the transistors T1 and T2, of which the transistor T2 forms an active NMOS load which is constantly driven by the reference voltage VREF and thus operates as a current sink. The transistors T1 and T2 interact in such a way that, at the node VC situated between them, a potential is established which is dependent on the level of the supply voltage VDD, on the potential established at the node VB (sum of the threshold voltages of the diodes D1 and D2), and on the W/L-ratio of the transistors T1 and T2.

The circuit is activated through the use of the activation signal BUSY. As a result, the transistors T3 and T4 are put into the on state (conducting state) and the (pull-up) transistor T5 is put into the off state (blocking state).

The on state of the transistor T3 causes the potential at the node VA to become equal to VDD. If and as long as the supply voltage VDD is high as intended, the transistor T1 has such a low impedance that a potential is established at the node VC which is so high that the output signal of the inverter I connected downstream is zero, the output signal simultaneously representing the output signal VDDERR of the entire circuit.

If and as long as there is a dip in the supply voltage VDD and thus also in the potential at the node VA, the transistor T1 acquires a higher impedance. If there is a sufficiently wide or long dip in the supply voltage VDD, the transistor T1 acquires such a high impedance that VC is discharged via the transistors T2 and T4. If VC is discharged to such an extent that the toggle point of the inverter I connected downstream is reached, then the output signal of the inverter becomes equal to VDD.

The effect achieved by the capacitor C is that the inverter I reacts only to supply voltage dips with a specific minimum duration (for example a few 10 ns).

The output signal VDDERR of the circuit is zero if and as long as the supply voltage VDD has approximately its desired value. If the supply voltage VDD falls below a predetermined value, then VDDERR changes to VDD a predetermined time after the predetermined value has been undershot (provided that the supply voltage VDD has not reached or exceeded the predetermined voltage again in the meantime). VDDERR remains at VDD potential until VDD has reached or exceeded the predetermined voltage again.

The output signal VDDERR thus signals the level of the supply voltage VDD. As long as VDDERR is equal to zero, the supply voltage VDD has approximately its desired value and it may be assumed that the integrated circuit to be monitored is operating properly. An abrupt rise in VDDERR is an indication that there has been a dip in VDD for a specific minimum duration, as a result of which the integrated circuit to be monitored may, temporarily, not have been operating properly.

In the example considered, such a rise is indicated visually and/or acoustically (in order to prompt the operator to perform suitable measures) or is used by the integrated circuit to be monitored or by another device to automatically initiate a repetition of the operations executed while the disturbances lasted, or a situation whereby the operations are disregarded. The automatic or manual initiation of the repetition of specific operations is expediently effected only after the supply voltage is again undisturbed, in other words when VDDERR equal to zero again.

The monitoring of the supply voltage described is carried out only if and as long as the activation signal BUSY is applied to the monitoring circuit. If the activation signal BUSY is not applied, then the transistor T5 ensures that the output signal VDDERR of the monitoring circuit is permanently at zero, as a result of which proper operation of the integrated circuit is signaled.

The effect that can be achieved in the manner described above is that the monitored integrated circuit can be operated with a considerably higher reliability than was previously the case.

We claim:

1. A method for monitoring a proper functioning of an integrated circuit, the method which comprises:

monitoring a supply voltage of an integrated circuit;

ascertaining a dip in the supply voltage;

effecting a signaling of the dip in the supply voltage only if the supply voltage falls below a given voltage for a given minimum duration; and repeating operations of the integrated circuit which are supplied by the supply voltage and have been influenced by the dip in the supply voltage, after an end of the dip in the supply voltage.

2. The method according to claim 1, which comprises effecting the signaling of the dip in the supply voltage by outputting a signaling signal having a voltage of substantially zero volts.

3. The method according to claim 2, which comprises providing the signaling signal as a signal having a value substantially equal to a value of the supply voltage if and as long as no dip in the supply voltage having a sufficient depth and length is present.

4. The method according to claim 1, which comprises carrying out the monitoring step only if and as long as an activation signal is applied to a monitoring circuit.

5. The method according to claim 4, which comprises, if the activation signal is not applied, outputting a signaling signal corresponding to a signaling signal that would be output if the supply voltage were properly high during an activated monitoring.

6. The method according to claim 1, which comprises checking a level of the supply voltage with a reference voltage which is independent of the level of the supply voltage.

7. The method according to claim 1, which comprises providing a monitoring circuit within the integrated circuit to be monitored for performing the steps of monitoring the supply voltage, ascertaining the dip in the supply voltage, and effecting the signaling of the dip in the supply voltage.

8. The method according to claim 1, which comprises repeating operations influenced by the dip in the supply voltage, after an end of the dip in the supply voltage.

9. A method for monitoring a proper functioning of an integrated circuit, the method which comprises:

monitoring a supply voltage of an integrated circuit;

ascertaining a dip in the supply voltage;

effecting a signaling of the dip in the supply voltage only if the supply voltage falls below a given voltage for a given minimum duration; and repeating operations of the integrated circuit which are supplied by the supply voltage and that have possibly been influenced by the dip in the supply voltage, after an end of the dip in the supply voltage.

* * * * *

UNITED STATES PATENT AND TRADEMARK OFFICE
CERTIFICATE OF CORRECTION

PATENT NO.    : 6,628,152 B1                                        Page 1 of 1
DATED         : September 30, 2003
INVENTOR(S)   : Thomas Kern et al.

It is certified that error appears in the above-identified patent and that said Letters Patent is hereby corrected as shown below:

<u>Column 6,</u>
Line 12, should read as follows: -- checking a level of the supply voltage dependent on a reference --

Signed and Sealed this

Twentieth Day of January, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,628,152 B1 Page 1 of 1
DATED : September 30, 2003
INVENTOR(S) : Kern et al.

It is certified that error appears in the above-identified patent and that said Letters Patent is hereby corrected as shown below:

Title page,
Item [*] Notice, delete "48" and insert -- 582 --.

Signed and Sealed this

Sixth Day of September, 2005

JON W. DUDAS
*Director of the United States Patent and Trademark Office*